United States Patent [19]
Momodomi et al.

[11] Patent Number: 5,400,279
[45] Date of Patent: Mar. 21, 1995

[54] NONVOLATILE SEMICONDUCTOR MEMORY DEVICE WITH NAND CELL STRUCTURE

[75] Inventors: Masaki Momodomi, Yokohama; Yasuo Itoh, Kawasaki; Yoshihisa Iwata; Fujio Masuoka, both of Yokohama; Masahiko Chiba, Aomori, all of Japan

[73] Assignee: Kabushiki Kaisha Toshiba, Kawasaki, Japan

[21] Appl. No.: 67,005

[22] Filed: May 26, 1993

Related U.S. Application Data

[63] Continuation of Ser. No. 733,972, Jul. 22, 1991, abandoned, which is a continuation of Ser. No. 371,104, Jun. 26, 1989, abandoned.

[30] Foreign Application Priority Data

Jun. 27, 1988 [JP] Japan ................................. 63-156875

[51] Int. Cl.⁶ ............................................... G11C 7/00
[52] U.S. Cl. ............................ 365/185; 365/189.09; 365/189.11; 365/230.06; 365/233.5
[58] Field of Search .......... 365/104, 185, 174, 189.09, 365/189.11, 230.06, 233, 233.5, 194

[56] References Cited
PUBLICATIONS

Masuoka et al. "New Ultra High Density EEPROM and Flash EEPROM with NAND Structure Cell", IEDM Technical Digest, Dec. 6-9, 1987, pp. 552-555.
Shirota et al. "A New NAND Cell for Ultra High Density 5V-Only EEPROM," VLSI Research Center. Adler, Density Arrayed EEPROM Having Low Voltage Tunnel Write, IBM Tech. Disclosure Bulletin, vol. 27, No. 6, Nov. 84 pp. 3302-3307.

*Primary Examiner*—Eugene R. LaRoche
*Assistant Examiner*—Son Dinh
*Attorney, Agent, or Firm*—Oblon, Spivak, McClelland, Maier & Neustadt

[57] ABSTRACT

An electrically erasable programmable read-only memory has an array of programmable memory cells connected to parallel bit lines on a semiconductive substrate. The memory cells include NAND cell blocks each of which has a first selection transistor coupled to a corresponding bit line, a second selection transistor coupled to the ground potential, and a series array of memory cell transistors each having a floating gate and a control gate. Word lines are respectively connected to the control gates of the memory cell transistors. In a data read mode, a selection transistor of a certain NAND cell block including a selected memory cell transistor is rendered conductive to connect this cell block to a bit line associated therewith. Under such a condition, a low or "L" level voltage is applied by a row decoder & bootstrap circuit section to a word line connected to the selected memory cell transistor, and a pulse voltage signal having a high or "H" level is supplied by the row decoder & bootstrap circuit section to the remaining word lines, so that data stored in the selected memory cell is read out. The "H" level of the voltage signal is higher than the power supply voltage and yet lower than a normal "H" level used in data write and erase modes. The pulse width of the pulse voltage signal is shorter than the period of one read cycle.

16 Claims, 5 Drawing Sheets

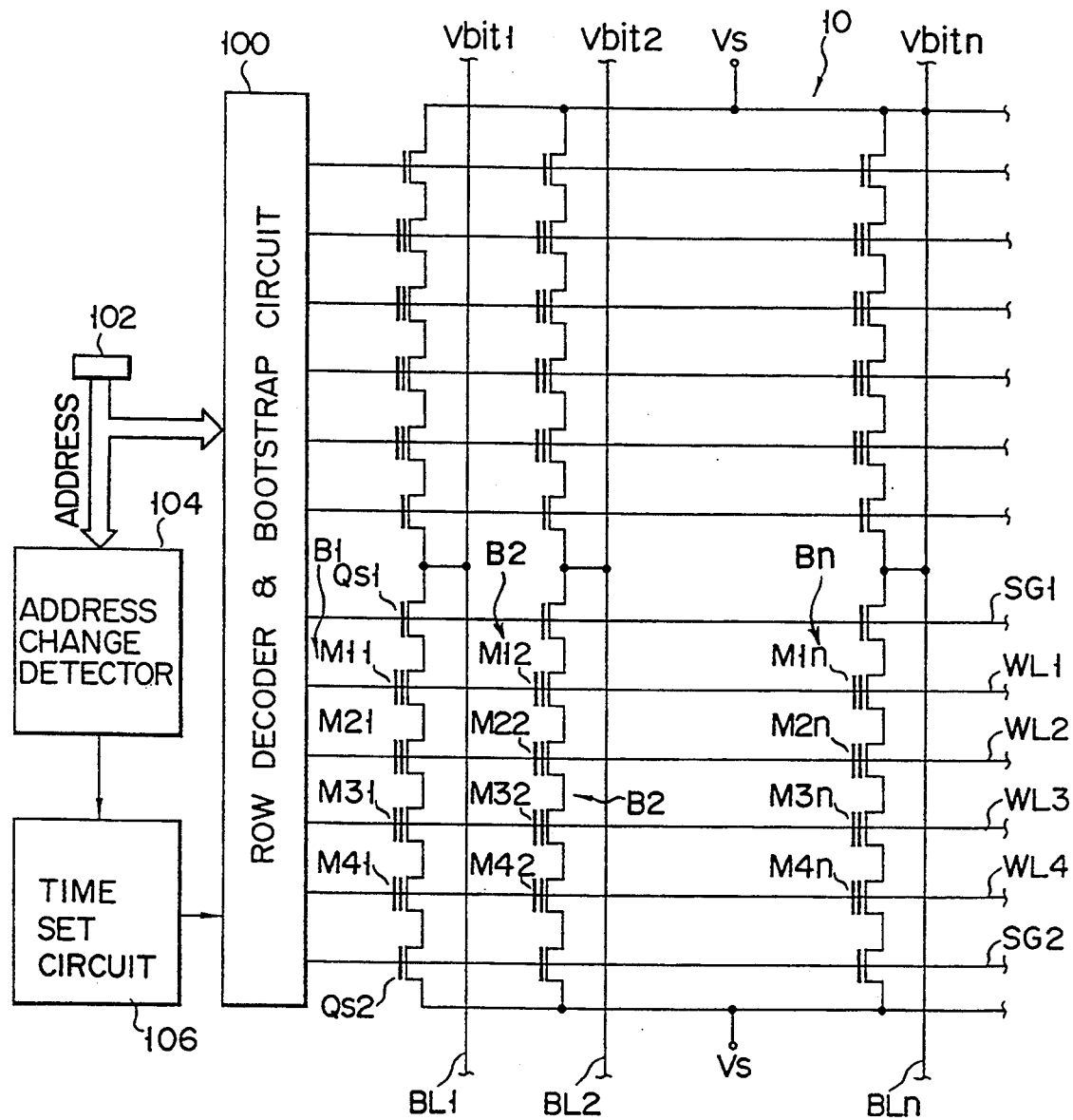
F I G. 1

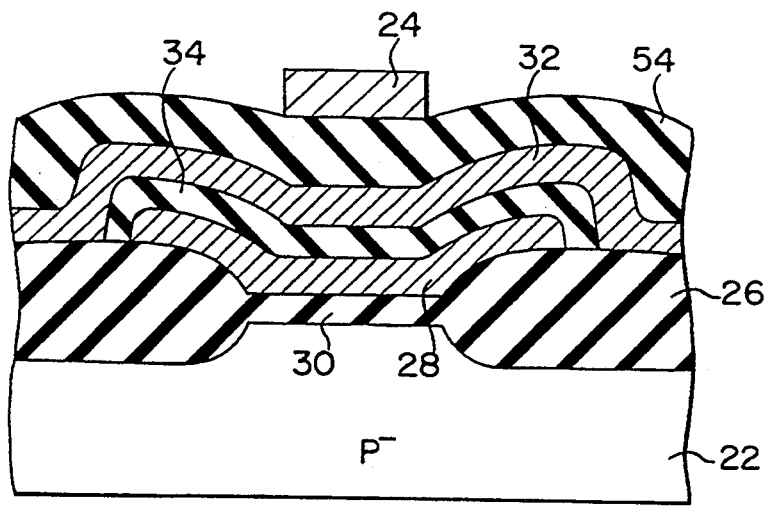
F I G. 3
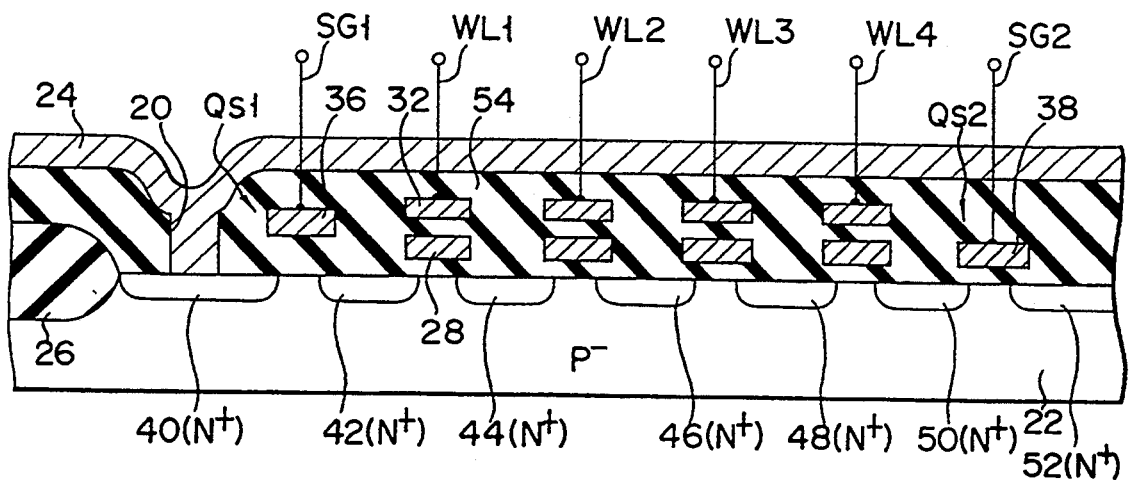
F I G. 4

NONVOLATILE SEMICONDUCTOR MEMORY DEVICE WITH NAND CELL STRUCTURE

This application is a continuation of application Ser. No. 07/733,972, filed on Jul. 22, 1991, which is a continuation of application Ser. No. 07/371,104, filed on Jun. 26, 1989, both now abandoned.

BACKGROUND OF THE INVENTION

1. Field of the Invention

The present invention relates to nonvolatile semiconductor memory devices and, more particularly, to an erasable programmable read-only memory.

2. Description of the Related Art

With the increasing needs for high performance and reliability of digital computer systems, there has been strongly demanded a nonvolatile semiconductor memory having a large data storage capacity for replacing an existing external data storage device such as a magnetic floppy disk drive unit, a fixed disk unit, etc. Although presently available electrically erasable programmable read-only memory devices have a technical merit such that a high-speed and high-reliability data write/read operation can be realized, these memory devices are not improved to obtain a sufficient data storage capacity.

One reason for the above problem is that, in a conventional electrically erasable programmable read-only memory (to be referred to as an "EEPROM" hereinafter), each memory cell for storing 1-bit data is basically constituted by two transistors. With such an arrangement, a cell area on a chip substrate can not be simply decreased without the use of a specialized high-integration element fabrication technique. According to the existing semiconductor fabrication technology, however, such an element fabrication technique is not perfectly established. Even if the specific element fabrication technique is perfectly established, low productivity avoids practical applications of the technique.

Recently, in order to solve the above problem, a specific type of EEPROM having a "NAND cell" structure has been proposed wherein each memory cell is constituted by only one transistor (field effect transistor), and a number of memory cells are connected in series in each array, thereby to remarkably decrease the number of contact portions between the cell array and a corresponding bit line, so that the integration density can be greatly improved.

The presently proposed "NAND cell" type EEPROM, however, suffers from insufficient reliability in a data read operation. More specifically, in the memory of this type, electric charge carriers (e.g., electrons) stored in a floating gate of a transistor of a selected memory cell are discharged to shift its threshold value in the negative-polarity direction, whereby a logic "1" data is stored in the selected memory cell. Electrons are injected into the floating gate of the transistor of the selected memory cell to shift its threshold value in the positive polarity direction, so that a logic "0" data is stored in the selected memory cell. In a typical example, when the logic "1" data is written, the threshold value of the selected memory cell is at least $-2$ V, and when the logic "0" data is written, the threshold value of the selected memory cell does not exceed $+3$ V: the difference between these voltages falls within 5 V. Such a small difference between the threshold value causes degradation of the reliability of a data read operation to be described below.

In the EEPROM of this type, when data stored in a desired memory cell is read out, a low or "L" level potential (e.g., 0 volts) is applied to a word line connected to the selected memory cell. In this state, it is detected whether a current is supplied to a NAND cell array including the selected memory cell, thereby to determine whether the logic "1" or "0" data is stored in the memory cell. When the high or "H" level potential is kept applied to non-selected word lines in such a data read cycle, the threshold value of the memory cell which stores the logic "1" data is gradually shifted in the positive-polarity direction. If the difference between the threshold value obtained when the logic "1" data is stored in the memory cell and that when the logic "0" data stored is small, a slight shift of the threshold value causes a decisive read error of the data. The larger the number of read cycles of the EEPROM, the higher the probability of generation of the read error.

In addition, when a large number of write and erase operations of the data are repeated, variations in threshold values of the memory cells are increased. If the threshold value of the erased memory cell is undesirably shifted to be a relatively large value having the positive polarity, the memory cell in the erase state cannot be enabled when the power supply voltage Vcc is used as an "H" level potential to be applied to the non-selected word lines in the following data read mode. This leads to an undesirable increase in the number of read errors of the EEPROM, thus degrading the operation reliability.

A NAND cell type EEPROM has been disclosed in U.S. Pat. No. 4,939,690 (filed Dec. 27, 1998, and patented Jul. 3, 1990) to Momodomi et al. entitled "Electrically Erasable Programmable Read-Only Memory with NAND Cell Structure that suppresses Memory Cell Threshold Voltage Variation" and assigned to the same assignee of the present application. The EEPROM includes an array of rows and columns of memory cell transistors, which are subdivided into a plurality of NAND cell sections each of which includes a predetermined number of series-connected memory cell transistors. Each memory cell transistor has a floating gate for storing charge carriers and an insulated control gate that overlies the floating gate. Each NAND cell section is coupled at its one node to a corresponding one of parallel bit lines through a selection transistor, and is connected at the other node to a source potential Vs by way of a second selection transistor. Each NAND cell section is coupled to parallel word lines at the control gates of the predetermined number of memory cell transistors included therein.

During an erase operation, all the memory cell transistors are erased at a time in such a manner that a high-level potential (20 volts, for example) is applied to the control gates of memory cell transistors while a low-level potential (zero volts, for example) is applied to the control gates of the first and second selection transistors, causing the memory cell array to be electrically disconnected from the bit lines and the source potential Vs. When the EEPROM is set in a data-write (program) mode, a selected NAND cell section is subjected to a selective program operation such that, while the high-level potential is applied to the first and second selection transistors causing them to turn on, the memory cell transistors are sequentially programmed in the reverse order that they are coupled to the corresponding bit line associated therewith, by applying the high-level potential to the gate electrodes of certain non-selected memory cell transistors that are positioned between the first selection transistor and a specific memory cell transistor as presently selected, thus allowing a data voltage to be transferred from the bit line toward the selected memory cell transistor.

The EEPROM may provides significant teachings as to the achievement of an enhanced reliability by eliminating the occurrence of an undesirable variation in the threshold values of the memory cell transistors during a program operation; unfortunately, the device is not provided with a means for improving the reliability during a read operation.

SUMMARY OF THE INVENTION

It is therefore an object of the present invention to provide a new and improved electrically erasable programmable read-only memory which is highly integrated to have a large data storage capacity and is excellent in its operation reliability.

In accordance with the above object, the present invention is addressed to a specific nonvolatile programmable semiconductor memory device which includes an array of rows and columns of memory cells on a substrate. Each of the memory cells includes a transistor having a charge storage layer and a control gate. The memory cells are subdivided into a plurality of groups each including a preselected number of memory cells which are series connected to one another. A plurality of bit lines are associated with the memory cell groups. A plurality of word lines extend transverse to the bit lines and coupled to the control gates of the transistors corresponding to the preselected number of memory cells in each group. A row decoder is coupled to the word lines, for designating a memory cell selected for read from those of a certain group as a selected memory cell in response to an address input externally supplied thereto. A voltage generator section is connected to the word lines and the row decoder on the substrate, for selectively providing the word lines with a first voltage which is greater in potential than a second voltage in such a manner that a selected word line coupled to the selected memory cell in the certain group is at the second voltage while non-selected word lines coupled to the remaining memory cells of the certain group are at said first voltage. A pulse width controller is connected to the row decoder and the voltage generator, for, during a read operation of the selected memory cell, causing the first voltage to be applied to non-selected word lines only during a limited time period, by forcing the application of the first voltage to terminate after a fixed length of time has passed from the beginning of the potential change of the non-selected word lines within the read cycle of the memory device.

The present invention and its objects and advantages will become more apparent from the following more particular description of a preferred embodiment of the invention, as illustrated in the accompanying drawings.

BRIEF DESCRIPTION OF THE DRAWINGS

FIG. 1 is a schematic diagram showing a circuit configuration of a memory cell matrix section of an electrically erasable programmable read-only memory (EEPROM) in accordance with one preferred embodiment of the present invention.

FIG. 3 is a diagram showing a cross-sectional view of the cell block taken along line III—III of FIG. 2.

FIG. 4 is a diagram showing another cross-sectional view of the cell block taken along line IV—IV of FIG. 2.

DETAILED DESCRIPTION OF PREFERRED EMBODIMENTS

Figure 2:
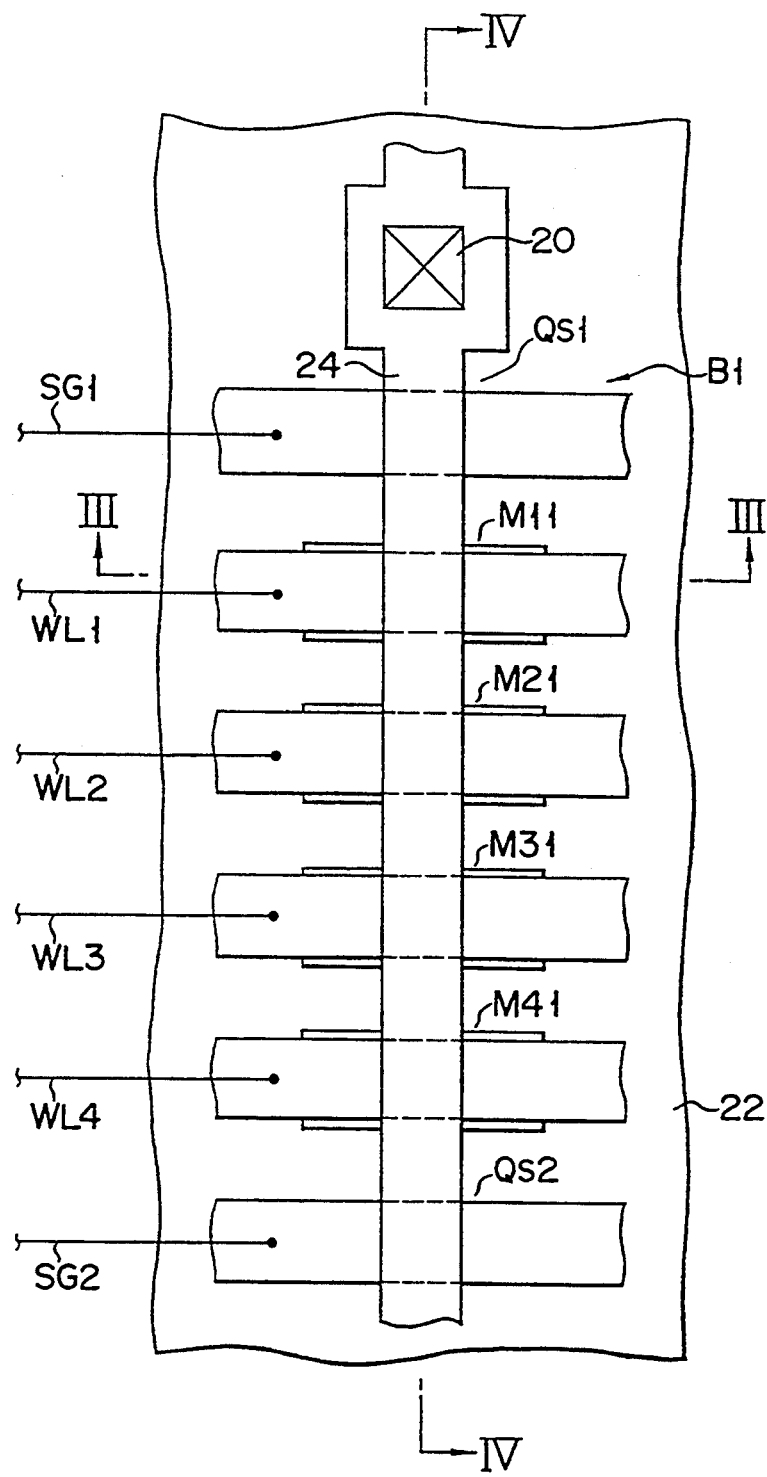
FIG. 2 is a diagram showing a plan view of a cell block including a selection transistor and memory cell transistors which are series-connected so as to constitute a "NAND cell" structure.

In FIG. 1, an EEPROM according to a preferred embodiment of the present invention has a memory cell matrix section generally designated by reference numeral "10." The memory cell section 10 includes a preselected number of parallel bit lines BL1, BL2, ..., BLn, (an arbitrary one of these bit lines is represented by reference symbol "BLi" hereinafter, and suffixes may be dropped when it is not necessary to distinguish among them), parallel word lines WL1, WL2, ..., WLm and memory cells M11, M21, M31, M41, M12, M22, ..., M4n respectively arranged at intersecting points of these bit and word lines. Where it is not necessary to distinguish a specific one among these cells, the suffixes may be dropped.

As shown in FIG. 1, the array of memory cells M connected to the bit lines BL1, BL2, ..., BLn in the memory cell section 10 are divided into subarrays (to be referred to as "NAND cell blocks" or "NAND cell units" hereinafter) B1, B2, ..., Bn, each of which has first and second "selection" transistors Qs1, Qs2 (suffixes may be dropped when it is unnecessary to distinguish between them), and a preselected number of memory cells. Each of the selection transistors Qs1, Qs2 constituted by a single gate type MOSFET. Each memory cell is basically constituted by a floating gate type MOSFET which has a floating gate and a control gate. Note that, in FIG. 1, only the NAND cell blocks B1, B2, ..., Bn respectively connected to the bit lines BL1, BL2, ..., BLn are shown in detail for the sake of illustrative convenience.

In the series array of transistors in each NAND cell block Bi, its one terminal (i.e., the drain of a memory cell transistor Mli) is connected to a corresponding bit line BLi through the first selection transistor Qs1, and the other terminal (i.e., the source of a memory cell transistor M4i) thereof is connected to a corresponding source potential Vs through the second selection transistor Qs2. The memory cells in each cell block Bi are constituted by series-connected memory cell transistors Mli, M2i, ..., Mmi so as to constitute a so-called "NAND cell" structure. In the following description, the number "m" of memory cell transistors included in each cell block is set to be as small as "4" for purposes of explanation; however, the transistor number will be set to be "8" or "16" in practice.

The selection transistors Qs and memory cell transistors M are connected to nodes of the bit and word lines BL, WL, as shown in FIG. 1, thereby to constitute a cell matrix configuration. Note that lines SG1, SG2 respectively connected to the first and second selection transistors Qs1, Qs2 are often referred to as "gate control lines" in this description.

As shown in FIG. 2, one NAND cell block (e.g., "B1") has a contact hole 20 on a lightly-doped P type silicon chip substrate 22. A connection wiring layer 24 is insulatively formed above the series-connected selection transistors Qs1, Qs2 and the memory cell transistors M11 to M41. The connection wiring layer 24 may be an aluminum layer which extends parallel with the array of the transistors Qs, M.

Also referring to the cross-sectional views in FIGS. 3 and 4, the transistor array in the NAND cell block B1 is formed in a substrate surface area which is surrounded by an insulative layer 26 for isolating elements formed on the substrate 22. As is most apparent from FIG. 3, a MOSFET M11 (other memory cells have the same arrangement as that of the MOSFET M11) constituting one memory cell has a first polycrystalline silicon layer 28 insulatively disposed by a thermal oxide film 30 above the substrate 22, and a second polycrystalline silicon layer 32 insulatively disposed above the layer 28 by a thermal oxide insulative layer 34. The first polycrystalline silicon layer 28 acts as a floating gate of the MOSFET M11, whereas the second polycrystalline silicon layer 32 serves as a control gate of it. The control gate 32 continuously extends in one direction to constitute the word line (a word line WL1 in the case of the memory cell M11). The selection transistor Qs1 has a polycrystalline silicon layer 36 insulatively disposed above the substrate 22. The selection transistor Qs2 includes a polycrystalline silicon layer 38 insulatively disposed above the substrate 22. These polycrystalline silicon layers 36, 38 serve as gates of the selection transistors Qs1, Qs2, respectively.

As shown in FIG. 3, the floating gate 28 extends onto the element isolation insulative layer 26, whereby a coupling capacitance Cfs between the floating gate 28 and the substrate 22 in each memory cell transistor is set smaller than a coupling capacitance Cfc between the floating gate 28 and the control gate 32, so that a write-/read operation of data can be performed only by moving electrons by a tunnel effect between the floating gate 28 and the substrate 22.

As shown in FIG. 4, heavily-doped N type diffusion layers 40, 42, 44, 46, 48, 50, 52 are formed on a surface portion of the substrate 22. These N type diffusion layers slightly overlap the gates of the transistors Qs, M, respectively. These N type diffusion layers serve as the sources and drains of corresponding transistors. For example, the N type diffusion layers 40, 42 respectively serve as the drain and source of the selection transistor Qs1. Similarly, the N type diffusion layers 42, 44 respectively serve as the drain and source of the cell transistor M11.

The above structure is entirely covered with a CVD insulation layer 54. The above-mentioned contact hole 20 is formed in this CVD layer 54. The aluminum connection wiring layer 24 is formed on the CVD layer 54, extends along the series connection of the transistors Qs, M, and overlaps the gates of the transistors Qs, M included in the cell block B1. The contact hole 20 is located on the drain diffusion layer 40 of the selection transistor Qs1. The connection wiring layer 24 is electrically contacted with the drain of the selection transistor Qs1 through the contact hole 20 to serve as a bit line of the NAND cell array.

According to this embodiment, the control and floating gate of each of the memory cell transistors have a width of 1 micrometer and a channel width of 1 micrometer. The floating gate extends from both sides of the wiring layer 24 having a width of 1 micrometer by 1 micrometer, as shown in FIG. 2. The first gate insulation film 30 (see FIG. 3) serves as a thermal oxide film having a thickness of, e.g., 20 nanometers; the second gate insulation film 34 serves as a thermal oxide film having a thickness of, e.g., 35 nanometers. The coupling capacitances Cfs, Cfc in this case are represented as follows:

$Cfs = \epsilon/0.02$ $Cfc = 3 \cdot \epsilon 3.5/0.035$ where "$\epsilon$" is the dielectric constant of each thermal oxide film. As a result, it is demonstrated that the NAND cell structure of this embodiment satisfies the above-mentioned conditions.

Referring back to FIG. 1, the word lines WL and the gate control lines SG1, SG2 are connected to a row decoder & bootstrap circuit 100. The circuit 100 receives an address signal supplied thereto from an address input terminal 102. The address input signal is also supplied to an address change detecting circuit 104. The address change detecting circuit 104 is connected to a time set circuit 106 including delay circuits. The time set circuit 106 is connected to the row decoder & bootstrap circuit 100.

The NAND cell type EEPROM with the above arrangement operates normally during a erase period and a data-write (program) period, as well known among those skilled in the art to which the present invention pertains; the device performs a "simultaneous erase" operation and a "selective write" operation in a similar manner to those of a NAND cell type EEPROM that has been already described in U.S. Pat. No. 4,939,690 as indicated previously in the introductory part of the specification.

The significance of the NAND cell type EEPROM lies in a specific read operation as will be described below.

When the EEPROM is set in a data read mode at time a turn-on potential (e.g., 5 volts) is applied to the control gate lines SG1, SG2, and the first and second selection transistors Qs1, Qs2 are rendered conductive thereby to connect the NAND cell block B1 to the corresponding bit line BL1 associated therewith and the source potential Vs, which is set at the "L" level.

Figure 5:
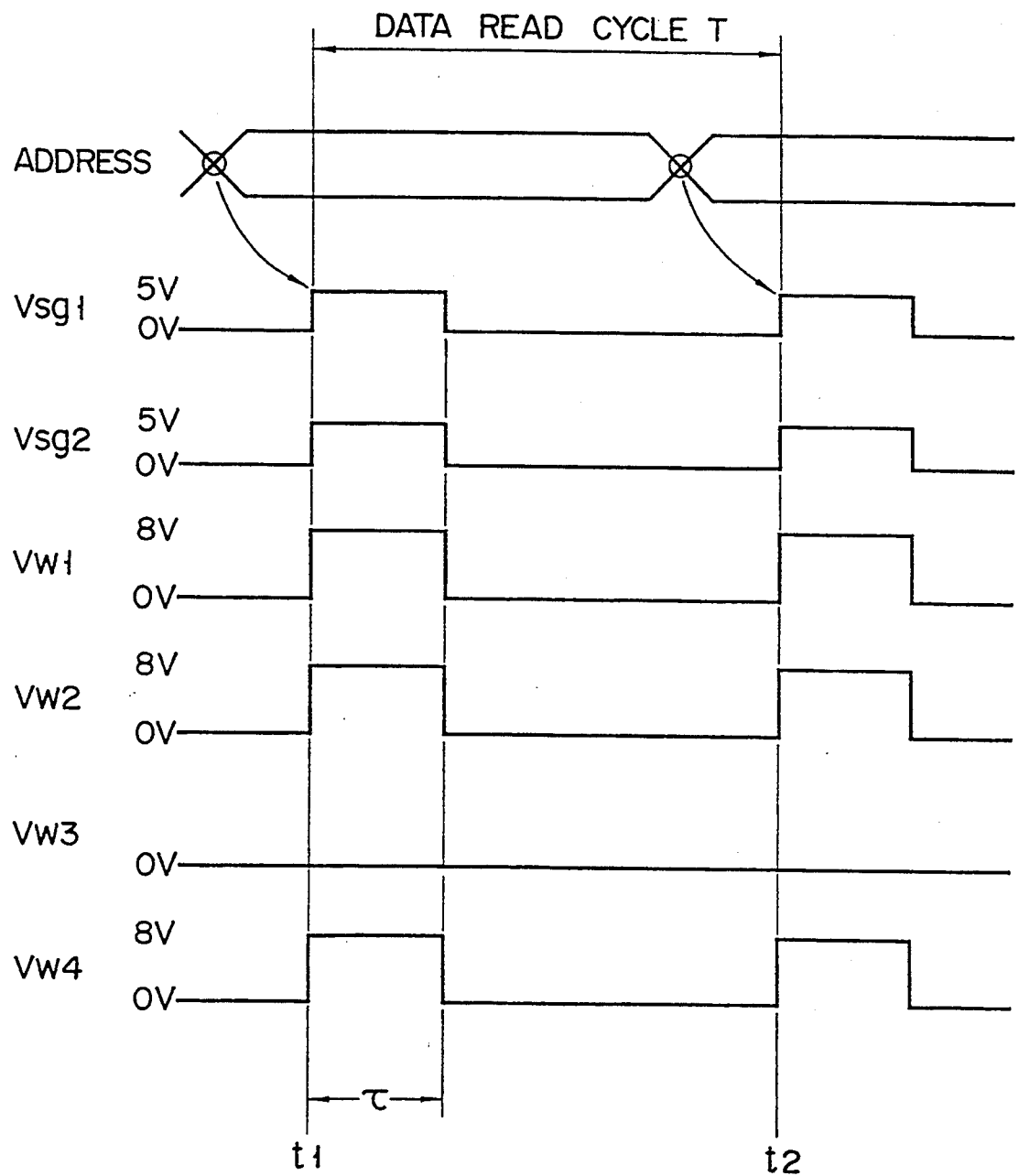
FIG. 5 is a diagram showing some typical waveforms of voltage signals which are generated at the main parts of the EEPROM in the data read mode thereof.

A case wherein an arbitrary memory cell in the NAND cell block B1, e.g., data stored in the memory cell M31 is read out will be described hereinafter with reference to FIG. 5. As shown in FIG. 5, the potential Vsg1, Vsg2 of the first and second selection transistors Qs1, Qs2 are set at the "H" level at time t1 in response to a change in address signal, whereby these transistors are rendered conductive. As a result, one terminal of the NAND cell array B1 is connected to the corresponding bit line BL1; the other terminal thereof is connected to the source potential Vs. Under such a condition, while the potential Vw3 of the word line WL3 of the selected cell M31 is set at "L" level (e.g., 0 V), the word line potentials Vw1, Vw2, Vw4 of the non-selected cells M11, M21, M41 are set at "H" level. The "H" level of the word line potentials Vw1, Vw2, Vw4 is set to a specifically selected value which is high enough to facilitate the memory cells M11, M21, M41 in an erase state to be easily turned on even when the threshold value thereof exceeds the power supply voltage Vcc (=5 V), and which is yet lower than the "H" level potential used in the data write mode and/or erase mode. In this embodiment, the "H" level of the word line potentials Vw1, Vw2, Vw4 is designed to be 8 V. With such a voltage application, a sensing operation is performed to detect a current flow in the selected memory cell M31, thereby to determine whether logic "1" or "0" data is stored in the memory cell M31.

With such an arrangement, when data stored in an arbitrary memory cell in an NAND cell array is read out, the "H" level voltage higher than the power supply voltage Vcc is applied to the wordlines connected to the remaining non-selected cells in the NAND cell array. Therefore, even if the threshold values of these cells are deviated, read error can be effectively suppressed or prevented. This suppression may contribute to the improvement of the operation reliability of the EEPROM.

It should be noted that, when the "H" level potential is continuously being applied to the non-selected memory cells M11, M21, M41 for a long time in a data read mode of the memory cell M31, the threshold value of a memory cell in the logic "1" state will be gradually shifted from the negative-polarity direction to the positive-polarity direction. This undesired level shift causes an erroneous data reading operation. According to the present invention, in order to eliminate such an undesired level shift, the "H" level voltages Vw1, Vw2, Vw4 applied to the word lines of the non-selected memory cells are supplied as pulse voltage signals, as shown in FIG. 5. The pulse width $\tau$ of the pulse voltage is set to be a constant width shorter than a read cycle period T, and does not depend on the read cycle period T. According to this embodiment, in consideration of execution of a sensing operation by supplying a current to a sense amplifier, the pulse width of the "H" level voltage was set within the range of 100 to 1000 nanoseconds, e.g., 200 nanoseconds.

Figure 6:
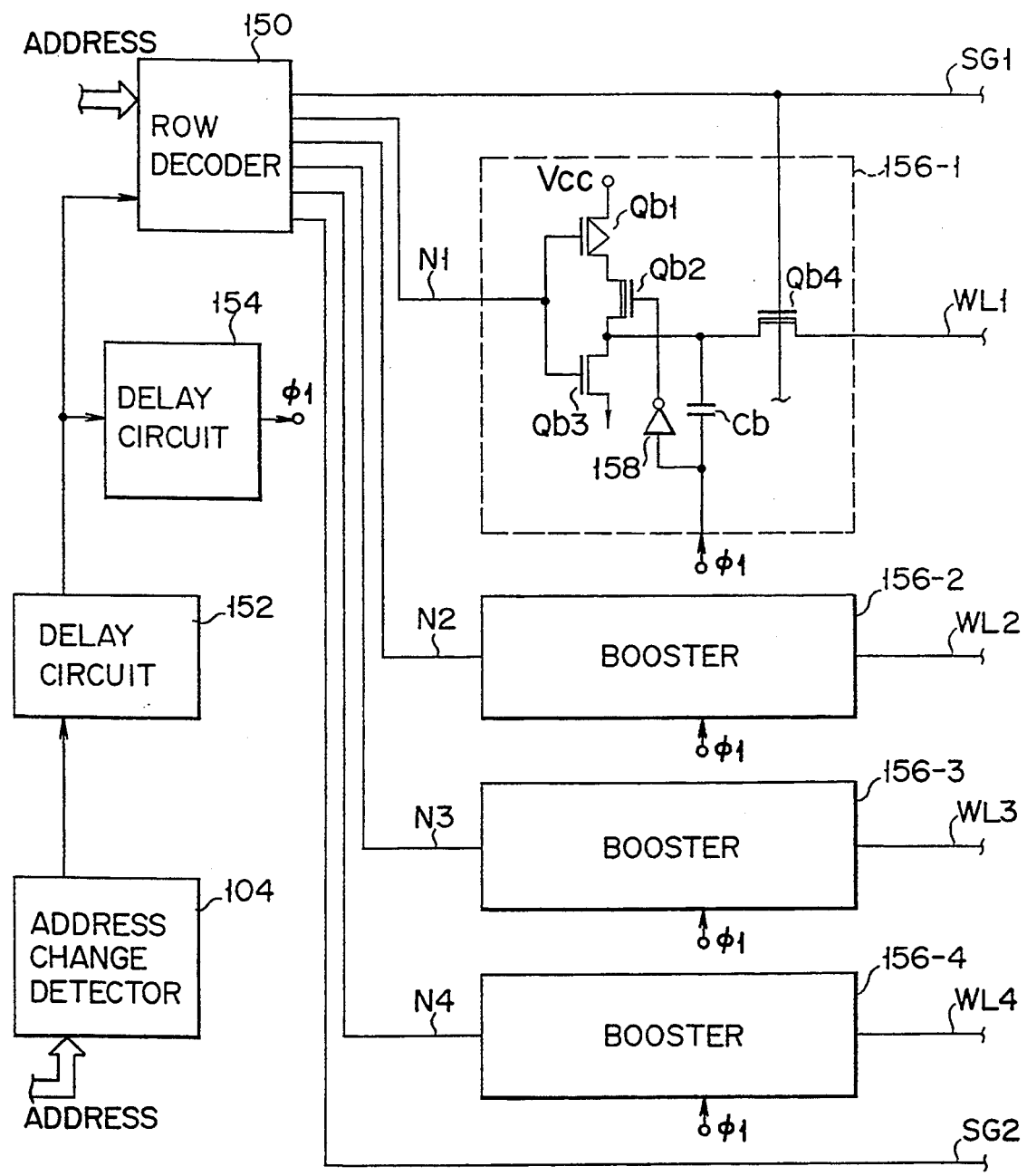
FIG. 6 is a diagram showing in detail the circuit configuration of a peripheral drive circuit of the memory cell matrix section of the EEPROM.

The pulse voltage signals Vw1, Vw2, Vw4 each having a specific "H" level potential (7 or 8 V, for example) higher than the power supply voltage Vcc (typically, 5 V) of the normal EEPROM, which are supplied to the word lines of the above-mentioned non-selected memory cells may be generated by the row decoder & bootstrap circuit 100 schematically shown in FIG. 1. A detailed arrangement of this peripheral drive circuit is shown in FIG. 6.

The address change detecting circuit 104 for receiving an address input is connected to a row decoder 150 through a first delay circuit 152. The output terminal of the first delay circuit 152 is connected to a second delay circuit 154. As shown in FIG. 6, the row decoder 150 is directly connected to the gate control lines SG1, SG2, and connected to the word lines WL1, WL2, WL3, WL4 through the booster circuits 156-1, 156-2, 156-3, 156-4, respectively. As shown in FIG. 6, each booster circuit 156-1 includes four transistors Qb1 to Qb4, a capacitor Cb, and an inverter 158. The internal arrangement of each booster circuit 156 itself is generally known, and does not require specific circuit design. When a read cell address is changed in a data read mode, the address change detecting circuit 104 detects the change in address to generate a pulse signal having "H" level as an address change detection signal. The address change detection signal is supplied to the first delay circuit 152. The first delay circuit 152 outputs a pulse signal having a pulse of, e.g., 200 nanoseconds in response to the address change detection signal. While an output signal of the first delay circuit 152 has the "H" level, the row decoder 150 is in an "enable" condition. Therefore, an output signal of the row decoder 150 can be input to the booster circuits 156.

According to the above-mentioned illustrative description, when the memory cell M31 is selected for data reading in the NAND cell block B1, the "H" level potential is applied only to a node N3 between the row decoder 150 and the booster circuit 156-3. As a result, the "L" level potential is applied to word line WL3. At this time, the "L" level potential is applied to nodes N1, N2, N4 between the row decoder 150 and the remaining booster circuits 156-1, 156-2, 156-4. An output signal of the first delay circuit 152 is supplied to a terminal $\phi$1 through the second delay circuit 154. When the potential at the terminal $\phi$1 is set at "H" level, booster circuits 156 are rendered active so that the potential of the output signal of the row decoder circuit 150 is potentially increased or bootstrapped. The potential is increased from the normal power supply voltage Vcc (5 V, for example) to about 7 to 8 V. As a result, the word lines WL1, WL2, WL4 of the non-selected memory cells M11, M21, M41 are set at the bootstrapped potential. Thereafter (after a time $\tau$ has elapsed), when the potential of the output signal of the first delay circuit 152 is changed to "L" level, the row decoder 150 is set in a "disable" condition. Therefore, the potentials of all the nodes N1 to N4 are dropped to the "L" level potential, and hence the gate control lines SG1, SG2 and all the word lines WL1 to WL4 are set at "L" level (i.e., 0 V).

Although the invention has been described with reference to a specific embodiment, it shall be understood by those skilled in the art that numerous modifications may be made which are within the spirit and scope of the invention.

For example, a "tunnel injection" type NAND cell utilizing only an electric field across the thickness of a gate insulation film has been described in the above embodiment; however, present invention can also be applied to a "hot electron injection" type NAND cell. A hot electron injection type memory cell structure is the same as that in the tunnel injection type cell structure except that write and erase operations are different. These different operations will be described below in detail. When an entire erase operation is performed, a selection transistor is turned on. All the bit and source lines and the substrate are set at 20 V, and all the word lines are set at 0 V. Therefore, the electrons are discharged from the floating gates to the substrate in all the memory cells, and the threshold values of the memory cells are in a negative erase state. Assume that the memory cell M31 of FIG. 1 is subjected to a data write operation. A voltage of 5 V is applied to the selected bit line BL1, a 15-V voltage is applied to the gate lines SG1, SG2 of the selected MOS transistor, a 8-V voltage is applied to the selected word line WL3, and the 15-V voltage is applied to the remaining non-selected word lines WL1, WL2, WL4. At this time, the selected memory cell M31 is set in a pentode operation, and hot electrons are generated and injected into the floating gate. The other memory cells are set in a triode operation mode because of their higher control gate voltages, and the electrons are not injected. A read operation can be performed as in the above embodiment.

The NAND cell constituted by four series-connected memory cells has been described in the above embodiment; however, an arbitrary number of memory cells can be used to constitute the NAND cell. In addition, although the read pulse has a voltage higher than the power supply voltage Vcc in the above embodiment, the power supply voltage Vcc can be employed when a variation in threshold values of the memory cells is small.

What is claimed is:

1. An electrically programmable memory device comprising:
   a substrate;
   an array of rows and columns of memory cells on said substrate, each of said memory cells including a transistor having a charge storage layer and a control gate, said memory cells being subdivided into a plurality of groups each including a preselected number of memory cells which are series connected to one another;
   bit lines associated with said groups;
   word lines transverse to said bit lines and coupled to control gates of those of transistors corresponding to said preselected number of memory cells in each group;
   row decoder means coupled to said word lines, for designating a memory cell selected for read from those of a certain group as a selected memory cell in response to an address input externally supplied thereto;
   voltage generator means coupled to said word lines and said row decoder means on said substrate, for selectively providing said word lines with a first voltage which is greater in potential than a second voltage in such a manner that a selected word line coupled to said selected memory cell in said certain group is at the second voltage while non-selected word lines coupled to the remaining memory cells of said certain group are at said first voltage; and
   pulse width controller means coupled to said row decoder means and said voltage generator means, for, during a read operation of said selected memory cell, applying said first voltage to non-selected word lines only during a limited time period, by forcing the application of said first voltage to terminate after a fixed length of time has passed from the beginning of the potential change of said non-selected word lines.

2. The device according to claim 1, wherein said limited time period is included in a corresponding effective read cycle having substantially a length defined by a first time point whereat the address input is made and a second time point whereat a next address input is made, whereby a total application time of the first voltage is shorter than the read cycle.

3. The device according to claim 1, wherein said pulse width controller means includes:
   address change detector means for detecting a change in address input designating said selected memory cell; and
   internal timer means responsive to said address change detector means, for forcing said pulsed first voltage to drop down to the second voltage after a predetermined time of limited length has elapsed within the read cycle.

4. The device according to claim 3, wherein said internal timer means includes a delay circuit arranged on said substrate.

5. The device according to claim 3, wherein said internal timer means includes delay circuits arranged on said substrate.

6. The device according to claim 3, wherein said predetermined time is fixed through the read operation.

7. The device according to claim 3, wherein said predetermined time is shorter than the half of a period of the read cycle.

8. An electrically erasable programmable semiconductor memory device comprising:
   a semiconductive substrate;
   parallel bit lines provided above said substrate;
   memory cells connected to said bit lines, said memory cells being arranged to define a plurality of cell sections each of which includes a selection transistor connected to a corresponding bit line and a series array of memory cell transistors connected at a first node thereof to said selection transistor and connected at a second node thereof to said substrate, each of said memory cell transistors having a charge storage layer and a control gate;
   parallel word lines provided above said substrate and connected to associated control gates of said memory cell transistors; and
   voltage applying means for reading out a data stored in a selected memory cell transistor in a certain cell section in a data read mode of said memory device, by rendering a selection transistor of said certain cell section conductive thereby to connect said certain cell section to a corresponding bit line associated therewith, applying a Low or "L" level voltage to a selected word line coupled to said selected memory cell transistor, and applying a pulsed voltage signal having a High or "H" level to non-selected word lines coupled to the remaining memory cell transistors in said certain cell section;
   wherein said voltage applying means comprises:
   first circuit means for generating, as said pulsed voltage signal having the "H" level, a voltage signal having a limited pulse width shorter than a period of a read cycle of said memory device, and
   second circuit means for determining a length of said pulse width.

9. The memory device according to claim 8, wherein said second circuit means comprises:
   address change detector means for detecting a change in address input designating said selected memory cell transistor; and
   timer means responsive to said address change detector means, for forcing said pulsed voltage signal to drop down from the "H" level to the "L" level after a predetermined time has elapsed in a read cycle.

10. The memory device according to claim 9, wherein said timer means includes a delay circuit.

11. The memory device according to claim 9, further comprising:
    another selection transistor coupled between said second node of series array of memory cell transistors in said certain cell section and a source potential, for causing said certain cell section to be selectively connected to said source potential.

12. An electrically erasable programmable semiconductor memory device comprising:
    a semiconductive substrate;
    an array of rows and columns of memory cells subdivided into a plurality of cell groups each including a predetermined number of series-connected memory cells having first and second nodes, each of said memory cells essentially consisting of a metal insulator semiconductor filed effect transistor having a charge storage layer and a control gate;
    parallel bit lines coupled to said cell groups;

parallel word lines transverse to said bit lines and coupled to control gates of those transistors of the rows of memory cells;

data reading means connected to said word lines, for reading a data stored in a desired memory cell being presently selected from a certain cell group in a read cycle, by applying a selected word line coupled to said desired memory cell with a Low or "L" level voltage, by applying non-selected word lines coupled to the remaining non-selected memory cells in said certain cell group with a High or "H" level voltage which is greater in potential than a power supply voltage in such a manner that said "H" level voltage is applied to said non-selected word lines for a limited period less in length than the read cycle; and said data reading means including, booster means for receiving the power supply voltage and for generating a potentially increased or bootstrapped voltage which is greater in potential than the power supply voltage as said "H" level voltage, and timer means arranged on said substrate for determining a predetermined period, and for forcing the application of said "H" level voltage to terminate within the read cycle when an elapsed time from the beginning of the potential change of said non-selected word lines becomes equal to the predetermined period in the read cycle, whereby a total application time of said "H" level voltage is shorter than a period of the read cycle.

13. The memory device according to claim 12, further comprising:
   first switch means for causing said cell groups to be selectively coupled at the first nodes to said bit lines;
   second switch means for causing said cell groups to be selectively coupled at the second nodes to a source potential;
   said data reading means connected to the first and second switch means, for applying said first and second switch means with a turn-on voltage causing said first and second switch means to turn on.

14. The memory device according to claim 12, wherein the "L" level voltage is substantially equivalent to a ground potential.

15. The memory device according to claim 12, wherein said timer means comprises a delay circuit.

16. The memory device according to claim 12, further comprising:
   address change detector circuit means for detecting an address change made to designate said desired memory cell; and
   wherein said timer means comprises:
   first delay circuit means responsive to said address change detector circuit means, for defining a first time point whereat said first and second switch means and said non-selected word lines begin to rise potentially; and
   second delay circuit means responsive to said first delay circuit means, for defining a second time point whereat the application of said "H" level voltage to said non-selected word lines is terminated.

* * * * *